United States Patent [19]

Stupp

[11] Patent Number: 4,761,679
[45] Date of Patent: Aug. 2, 1988

[54] COMPLEMENTARY SILICON-ON-INSULATOR LATERAL INSULATED GATE RECTIFIERS

[75] Inventor: Edward H. Stupp, Spring Valley, N.Y.

[73] Assignee: North American Philips Corporation, New York, N.Y.

[21] Appl. No.: 115,583

[22] Filed: Oct. 23, 1987

Related U.S. Application Data

[63] Continuation-in-part of Ser. No. 945,417, Dec. 22, 1986, abandoned.

[51] Int. Cl.[4] .............................................. H01L 29/78
[52] U.S. Cl. .................................. 357/23.1; 357/23.4; 357/23.7; 357/23.9; 357/38; 357/42; 357/4
[58] Field of Search .................. 357/23.4, 23.5, 23.7, 357/23.9, 23.11, 42, 38, 39, 86, 4, 23.1

[56] References Cited

U.S. PATENT DOCUMENTS

| | | | |
|---|---|---|---|
| 4,072,975 | 2/1978 | Ishitani | 357/41 |
| 4,224,634 | 9/1980 | Svedberg | 357/42 |
| 4,462,040 | 7/1984 | Ho et al. | 357/23.4 |
| 4,546,375 | 10/1985 | Blackstone et al. | 357/23.4 |
| 4,568,958 | 2/1986 | Baliga | 357/23.4 |
| 4,686,551 | 8/1987 | Mihara | 357/23.4 |

FOREIGN PATENT DOCUMENTS 55-65463  5/1980  Japan .................. 357/23.4

*Primary Examiner*—Martin H. Edlow
*Assistant Examiner*—Gregory A. Key
*Attorney, Agent, or Firm*—Jack Oisher; Steven R. Biren

[57] ABSTRACT

A complementary Silicon-On-Insulator (SOI) Lateral Insulated Gate Rectifier (LIGR) is fabricated in a monocrystalline silicon layer provided on a major surface of a substantially insulating substrate. The monocrystalline silicon layer includes a number of adjacent, doped coplanar layer portions, with the complementary SOI LIGR device being formed of adjacent, contacting layer portions forming two complementary LIGR elements with a common source region. The common source region, as well as both of the drain regions of the device, are composed of regions of both the first and second conductivity types. In this manner, a simple, easily fabricated, balanced, high performance complementary LIGR structure is obtained in which undesired substrate currents are substantially eliminated.

3 Claims, 1 Drawing Sheet

COMPLEMENTARY SILICON-ON-INSULATOR LATERAL INSULATED GATE RECTIFIERS

This is a continuation-in-part of application Ser. No. 945,417, filed Dec. 22, 1986, now abandoned.

BACKGROUND OF THE INVENTION

The invention is in the field of Silicon-On-Insulator (SOI) devices, and relates specifically to complementary lateral insulated gate rectifiers for use in power circuit applications such as the electronic control of discharge lamps.

Known power control circuits frequently use a half-bridge configuration, with two identical switching transistors connected in series, with the source of one transistor connected to the drain of another to form a common output terminal. This type of configuration is typically used for integrated power circuits, because the required voltage rating of the transistors is lowest. Nevertheless, there are certain disadvantages to this configuration. For example, one transistor operates as a source follower, with an inherently higher "on" resistance than a common-source configuration and lower breakdown voltage to substrate when using standard constructions. While these disadvantages may be overcome, for example by using the source follower structure shown in U.S. patent application Ser. No. 766,665, the resulting structure will be more complex and difficult to fabricate.

Another solution, typically used for discrete component circuits, uses complementary MOS FET devices in a common-drain configuration. However, such a configuration is not practical in an integrated configuration, because of fabrication difficulties and because the two devices, if integrated, would have substantially different "on" resistances, thus resulting in an unbalanced output waveform.

These disadvantages are overcome, in accordance with the invention contained in my co-pending U.S. patent application Ser. No. 945,470, entitled COMPLEMENTARY LATERAL INSULATED GATE RECTIFIERS and incorporated herein by reference. That application discloses a complementary MOS Lateral Insulated Gate Rectifier (LIGR) configuration which is suitable for use in power circuit configurations, which can be easily and inexpensively integrated, and which has two complementary switching devices with comparable "on" resistances.

Nevertheless, it would be desirable to obtain an LIGR construction having a simpler structural configuration, and in which substrate currents which could affect switching characteristics and control functions in a power IC device are substantially eliminated.

SUMMARY OF THE INVENTION

It is therefore an object of the present invention to provide a complementary device suitable for use in power circuit applications, such as those requiring a half-bridge configuration, without the need for a source follower circuit.

Further objects of the invention are to provide a complementary device suitable for power circuit applications having a simplified structure which can be easily and inexpensively integrated, while at the same time having two complementary switching devices with comparable "on" resistances.

Yet another object of the invention is to provide a complementary device in which substrate currents, which could affect switching characteristics or the operation of the control circuiting in power IC applications, are substantially eliminated.

In accordance with the invention, these objections are achieved by a unique complementary SOI Lateral Insulated Gate Rectifier (LIGR) configuration. The LIGR is a relatively new type of device which has been found suitable for high-power switching applications. Several configurations for individual LIGR devices are shown, for example, in European Patent Application No. 83112186.8 (corresponding to U.S. Ser. No. 449,321). As can be seen in that reference, the configuration of an individual LIGR is quite similar to that of a lateral MOS transistor, and the problems associated with integrating two such devices into a complementary integrated circuit structure are similar to those described above.

These problems have been substantially overcome by a unique integrated complementary LIGR structure in accordance with the invention described in my aforementioned application. In that structure, a semiconductor substrate of a first conductivity type is provided with first and second adjacent surface-adjoining semiconductor wells of a second, opposite conductivity type, with a portion of the substrate separating the two adjacent wells. Complementary LIGR elements are then fabricated in the two adjacent wells, with junction isolation to the substrate being provided by p-n junctions formed between the semiconductor wells and the semiconductor substrate, which is of opposite conductivity type to that of the wells. Such a device yields a structure which is both simpler and more easily fabricated than prior-art structures of comparable performance, but further simplification, as well as improved device-substrate isolation to limit substrate currents, would be desirable.

These further improvements are achieved by a unique integrated complementary SOI LIGR structure in accordance with the present invention. In this structure, a substantially insulating substrate having a major surface is provided with a monocrystalline silicon layer on the major surface. The monocrystalline silicon layer includes a number of adjacent, doped coplanar layer portions. A complementary SOI LIGR structure is achieved by adjacent, contacting layer portions, which form two complementary LIGR elements having a common source region. In accordance with the invention, the common source region, as well as both of the drain regions of the device, are composed of regions of both the first and second conductivity types. In this manner, a simple, easily fabricated, balanced, high performance complementary LIGR structure is obtained.

Figure 1:
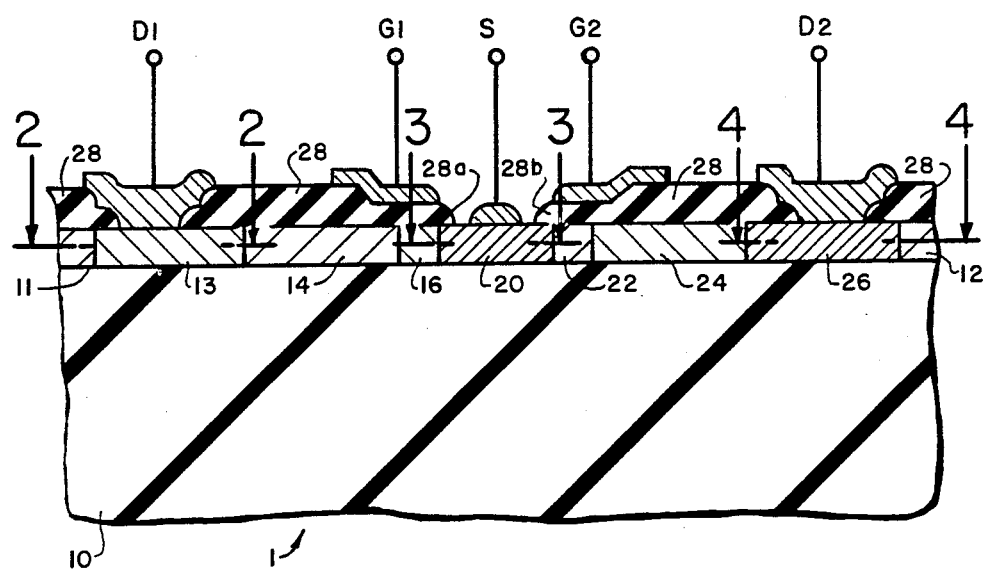
FIG. 1 is a cross-sectional view of an SOI LIGR in accordance with the invention.

In the drawing, semiconductor layers and regions of like conductivity type are generally hatched in the same direction. Thus, p-type regions are hatched from lower left to upper right, while n-type regions are hatched from upper left to lower right. Furthermore, it should be noted that the figures are not drawn to scale, and that, in particular, dimensions in the vertical direction have been exaggerated for improved clarity.

DESCRIPTION OF THE PREFERRED EMBODIMENT

FIG. 1 of the drawing shows a complementary Silicon-On-Insulator (SOI) Lateral Insulated Gate Rectifier (LIGR) device suitable for use in power circuit applications, particularly those in which it is desired to substantially eliminate substrate currents. In FIG. 1, an SOI LIGR device 1 has a substantially insulating substrate 10 with a major surface 11. The substrate material may be selected from a number of suitable insulating materials, such as oxidized silicon, quartz, or the like, as will be apparent to those of ordinary skill in the art. A monocrystalline silicon layer 12 is provided on major surface 11 of the insulating substrate, and a number of adjacent, coplanar, doped layer portions are formed in layer 12. These adjacent layer portions form the active regions of the LIGR device, as will be described in further detail hereinafter. Silicon layer 12 may be provided by any one of a number of well-known fabrication techniques, including laser/lamp recrystallization of silicon and bond/etch-back, whereby two oxidized silicon wafers are bonded in an oxidizing ambient and one of the wafers is subsequently thinned to the appropriate dimensions.

The monocrystalline silicon layer 12 may vary greatly in thickness, from less than about 1000 angstroms up to several microns, depending upon the parameters required for the specific design contemplated, and is initially of substantially undoped material prior to the formation of the doped layer portions. It is a particular advantage of the SOI technology that various parameters, such as layer thickness, can be selected over a wide range, thus making the basic structure suitable for a wide range of applications. A typical layer thickness for layer 12 would be about 1 micron.

Monocrystalline silicon layer 12 includes a first layer portion 13, which has regions of both a first (p) and a second, opposite (n) conductivity type, which together form a first drain region of the LIGR device. The structure of the first drain region will be described in greater detail below, in connection with the description of FIG. 2. The doping level of both the p-type and n-type regions of the first layer portion is on the order of $10^{18}$ atoms/cm$^3$.

A second layer portion 14 of the first conductivity type (here p-type) is provided in contact with the regions of the first layer portion, and forms a first drift region of the LIGR device. The doping level of the p-type material of layer portion 14 is about $10^{15}$ atoms/cm$^3$. A third layer portion 16 of the second conductivity type (here n-type) is provided in contact with layer portion 14, and has a doping level of about $10^{15}$ atoms/cm$^3$. In operation, a first channel region is formed in layer portion 16. It should be noted that all of the layer portions so far described, as well as those to be described, have substantially the same thickness, as they are all obtained by appropriate doping of portions of monocrystalline silicon layer 12. As noted above, the thickness of this layer may vary from less than 1000 angstroms up to several microns, depending upon the particular application of the device to be fabricated.

A fourth layer portion 20, having regions of both the first (p) and the second (n) conductivity types is provided in contact with the third layer portion, and forms a common source region for both halves of the complementary LIGR device. The n-type and p-type regions of fourth layer portion 20 both have a doping concentration level of about $10^{18}$ atoms/cm$^3$, and are described in further detail hereinafter in connection with the description of FIG. 3, which shows a sectional plan view of fourth layer portion 20.

The second half of the LIGR device shown in FIG. 1, namely that portion of the device starting with the common source region formed by layer portion 20, is essentially a mirror image of the first portion of the device already described, but with the conductivity type of each layer portion reversed. Thus, a fifth layer portion 22 of the first (p) conductivity type is provided in contact with layer portion 20, with a second channel region being formed in this layer portion during operation. The doping concentration level of layer portion 22 is about $10^{15}$ atoms/cm$^3$, and again, this layer portion, as well as the remaining layer portions on the major surface of the insulating substrate, has the same thickness as the previously-described layers.

A sixth layer portion 24 of the second (n) conductivity type and having a doping concentration level of about $10^{15}$ atoms/cm$^3$ is provided in contact with fifth layer portion 22, and forms a second drift region of the complementary LIGR device during operation.

The portion of the device structure provided in the monocrystalline silicon layer 12 is completed by seventh layer portion 26, having regions of both the first (p) and second (n) conductivity types. Layer portion 26 is provided in contact with sixth layer portion 24, and forms a second drain region of the complementary LIGR device. The construction of seventh layer portion 26 will be described in further detail hereinafter with reference to FIG. 4, which is a sectional plan view of the second drain region.

The device structure is completed by providing an insulating layer 28 over portions of monocrystalline silicon layer 12, with insulating layer portions 28a and 28b covering at least third layer portion 16 and fifth layer portion 22, respectively. First and second gate electrodes $G_1$ and $G_2$ are then provided on insulating layer portions 28a and 28b, respectively, over layer portions 16 and 22. The device construction is completed by a source electrode S connected to fourth layer portion 20, and first and second drain electrodes $D_1$ and $D_2$ connected to first layer portion 13 and seventh layer portion 26, respectively.

Figure 2:
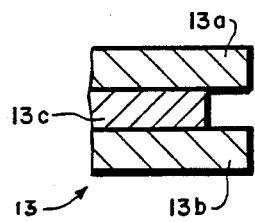
FIGS. 2, 3 and 4 are plan views of portions of the device of FIG. 1 taken along the section lines II—II, III—III and IV—IV, respectively, in FIG. 1.
Figure 3:
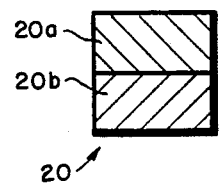
Figure 4:
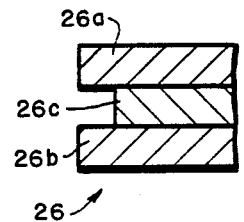

As mentioned above, the layer portions 13 and 26 forming the drain regions of the complementary device, as well as layer portion 20 forming the common source region, are composed of a plurality of regions of different conductivity types. Sectional plan views of layer portions 13, 20 and 26 are shown in FIGS. 2, 3 and 4, respectively. In FIG. 2, it can be seen that layer portion 13 comprises a pair of regions 13a,b of the second (n) conductivity type on either side of a region 13c of the first conductivity type, with the region 13c slightly inset from the regions 13a and 13b. It should be noted that while a three-region structure is shown in FIG. 2 for simplicity, region 13 may in fact include a larger number of such alternating regions. Similarly, layer portion 20 comprises at least one region 20a of the second (n) conductivity type and one region 20b of the first (p) conductivity type. Again, layer portion 20, shown here as having only two regions, may advantageously have additional regions of alternating conductivity types. Finally, layer portion 26, shown in FIG. 4, is essentially a mirror image of the structure shown in FIG. 2, with two regions 26a,b of the first (p) conductivity type surrounding a third inset region 26c of the second conductivity type. As in the case of layer portion 13, layer portion 26 may consists of further regions of alternating conductivity types, repeating the pattern shown in FIG. 4. All of the regions of layer portions 13, 20 and 26 are highly doped, with a doping concentration of about $10^{18}$ atoms/cm$^3$. It should be noted that the alternating conductivity type regions of layer portions 13, 20 and 26 do not present a serious fabrication complication, as they may be easily formed by a conventional masking process, as will be recognized by those of ordinary skill in the art. For a typical device construction, in which silicon layer 12 has a thickness of about 1 micron, the inset regions 13c and 26c of the drain regions 13 and 26 are inset from the adjacent regions (13a, b and 26a, b respectively) be between about 0.5 and 10.0 microns, with a typical value of about 5 microns. It should be noted that the "inset" dimension refers to the horizontal distance by which the right edge of region 13c is displaced to the left of the right edges of regions 13a and 13b in FIG. 2, as well as the like horizontal distance by which the left edge of region 26c is displaced to the right of the left edges of regions 26a and 26b in FIG. 4. The width of inset regions 13c and 26c (i.e. their vertical dimension in the plan view of FIGS. 2 and 4, respectively) is between about 5 and 50 microns, with a typical value of about 25 microns.

From an operational viewpoint, the device shown in FIG. 1 can be considered as two complementary (i.e. p-channel and n-channel) LIGR devices with a common source region 20 connecting the two device elements. The operational advantages of such a device, in terms of balanced "on" resistance and ease of fabrication, are the same as described in my co-pending above-identified U.S. Patent Application. Additionally, by providing the active device structure on a substantially insulating substrate, the additional advantage is achieved that undesirable substrate currents are substantially eliminated, thus enhancing switching characteristics and providing isolation from control circuitry on the same substrate.

It should be noted that the interdigitated drain structure of the present invention (see FIGS. 2 and 4), having both p-type and n-type regions, is analogous to and serves the same function as the multiple drain regions 20, 20a and 30, 30a in FIG. 2 of my above-referenced co-pending application. Thus, at low current conduction levels between source and drain, all of the current will flow to the region of the drain having the same conductivity type as the remainder of the conductive path between source and drain. When the current increases sufficiently such that the voltage drop across the drain regions in the vicinity of the inset at the right-hand portion of region 13c in FIG. 2 and the left-hand portion of the region 26c in FIG. 4 exceeds 0.7 volts, then the opposite conductivity type region in the drain, which forms a p-n junction with its associated drift region, will become forward biased and will start injecting minority characters.

In the present invention, the source region 20 also has an interdigitated construction, with at least one p-type and one n-type region, as shown in FIG. 3, with the source electrode S shown in FIG. 1 contacting both the p-type and n-type regions. The n-type region of the source, in contact with channel region 16, permits formation of a p-channel during operation, while the p-type region of the source acts as a source of holes to flow through the device to the drain. Electrons flowing from the n-type region of the drain flow through the n-type channel region and are collected through the n-type region of source 20. Operation of the right-hand element of the device, shown in the right-hand portion of FIG. 1, is analogous, except that the polarities are reversed.

In summary, the present invention provides a complementary SOI LIGR switching device which can be easily and inexpensively integrated, and which is capable of providing two complementary switching devices having comparable "on" resistances. Furthermore, these advantages are achieved without the need for a source-follower circuit, and in a device in which substrate currents are substantially eliminated.

While the invention has been particularly shown and described with reference to several preferred embodiments thereof, it will be understood by those skilled in the art that various changes in form and detail may be made without departing from the spirit or scope of the invention.

I claim:

1. A complementary Silicon-On-Insulator (SOI) Lateral Insulated Gate Rectifier (LIGR), which comprises:
   a substantially insulating substrate having a major surface;
   a monocrystalline silicon layer on said major surface, said layer comprising a plurality of adjacent, coplanar, doped layer portions;
   a first layer portion, having regions of both a first and a second, opposite conductivity type and forming a first drain region of said complementary LIGR;
   a second layer portion of said first conductivity type in contact with said first layer portion and comprising a first drift region of said complementary LIGR;
   a third layer portion of said second conductivity type in contact with said second layer portion and comprising a first channel region of said complementary LIGR;
   a fourth layer portion, having regions of both said first and second conductivity types, in contact with said third layer portion and forming a common source region of said complementary LIGR;
   a fifth layer portion of said first conductivity type in contact with said fourth layer portion and comprising a second channel region of said complementary LIGR;
   a sixth layer portion of said second conductivity type in contact with said fifth layer portion and comprising a second drift region of said complementary LIGR;
   a seventh layer portion, having regions of both said first and second conductivity types, in contact with said sixth layer portion and forming a second drain region of said complementary LIGR;
   an insulating layer over portions of said monocrystalline silicon layer and covering at least said third and fifth layer portions;
   first and second gate electrodes on said insulating layer and over said third and fifth layer portions, respectively;
   a source electrode connected to said fourth layer portion; and
   first and second drain electrodes connected to said first and seventh layer portions, respectively.

2. A complementary SOI LIGR as in claim 1, wherein said first layer portion comprises at least one region of said first conductivity type, with regions of said second conductivity type on both sides thereof, each of said first layer portion regions extending in the lateral direction to contact said second layer portion; said seventh layer portion comprises at least one region of said second conductivity type, with regions of said first conductivity type on both sides thereof, each of said seventh layer portion regions extending in the lateral direction to contact said sixth layer portion; and said fourth layer portion comprises at least one region of said first conductivity type and one region of said second conductivity type, each of said fourth layer portion regions extending in the lateral direction from said third layer portion to said fifth layer portion.

3. A complementary SOI LIGR as in claim 2, wherein said at least one region of said first conducting type of said first layer portion is inset with respect to said regions of said second conductivity type of said first layer portion adjacent said first drift region, and said at least one region of said second conductivity type of said seventh layer portion is inset with respect to said regions of said first conductivity type of said seventh layer portion adjacent said second drift region.

* * * * *